US012803846B2

(12) United States Patent
Wenndt et al.

(10) Patent No.: US 12,803,846 B2
(45) Date of Patent: Nov. 17, 2026

(54) SYSTEMS AND METHODS FOR OPERATING AN ARINC-429 TRANSMITTER

(71) Applicant: Liebherr-Electronics and Drives GmbH, Lindau (DE)

(72) Inventors: Sarah Wenndt, Friedrichshafen (DE); Matthias Geipel, Lindau (DE); Lars Hummel, Wangen (DE); Alexander Feldengut, Sulzberg (DE)

(73) Assignee: Liebherr-Electronics and Drives GmbH, Lindau (DE)

( * ) Notice: Subject to any disclaimer, the term of this patent is extended or adjusted under 35 U.S.C. 154(b) by 84 days.

(21) Appl. No.: 18/895,738

(22) Filed: Sep. 25, 2024

(65) Prior Publication Data

US 2025/0106070 A1 Mar. 27, 2025

(30) Foreign Application Priority Data

Sep. 25, 2023 (DE) ..................... 10 2023 125 859.1

(51) Int. Cl.

| | |
|---|---|
| ***H04L 25/02*** | (2006.01) |
| ***H03F 3/45*** | (2006.01) |
| ***H04B 1/04*** | (2006.01) |
| ***H04L 25/03*** | (2006.01) |

(52) U.S. Cl.

CPC ........... *H04L 25/0272* (2013.01); *H03F 3/45* (2013.01); *H04B 1/04* (2013.01); *H04L 25/03* (2013.01); *H04B 2001/0408* (2013.01)

(58) Field of Classification Search

CPC ......... H04B 1/04; H03F 3/45; H04L 25/0272; H04L 25/03

USPC .......................................................... 375/262

See application file for complete search history.

(56) References Cited

U.S. PATENT DOCUMENTS

2016/0218771 A1* 7/2016 Ishikawa ................. H04L 43/50

FOREIGN PATENT DOCUMENTS

| | | |
|---|---|---|
| BR | PI0 511 756 A | 1/2008 |
| CN | 1 01 533 378 A | 9/2009 |

OTHER PUBLICATIONS

Extended Search Report from EP Application No. 24194305.9 dated Feb. 14, 2025.

Vyas, et al., "Development of SoC for interfacing avionics units with ARINC 429 bus," 2016 International Conference on Communication and Electronics Systems(ICCES), IEEE Oct. 21, 2016 pp. 1-5.

Search Report from priority German Application No. DE 10 2023 125 859.1 dated Apr. 9, 2024 (7 pages).

* cited by examiner

*Primary Examiner* — Leila Malek

(74) *Attorney, Agent, or Firm* — Troutman Pepper Locke LLP; Ryan A. Schneider; Korbin M. Blunck

(57) ABSTRACT

A system for, and method of, operating an ARINC-429 transmitter by receiving a signal sequence from a transmission unit and converting the signal sequence into a differential output signal for outputting to a receiver. The transmission unit generates a signal sequence for the ARINC-429 transmitter. The ARINC-429 transmitter is configured to transmit an output signal at a high or a low transmission rate to the receiver depending on a received signal sequence from the transmission unit. The data transmission rate at the low transmission rate can be in the range of 12-14.5 kb/s±1% and the data transmission rate at the high transmission rate can be 100 kb/s±1%.

26 Claims, 3 Drawing Sheets

SYSTEMS AND METHODS FOR OPERATING AN ARINC-429 TRANSMITTER

CROSS-REFERENCE TO RELATED APPLICATIONS

This application claims benefit under 35 USC § 119 of DE Application No. 10 2023 125 859.1 filed 25 Sep. 2023, which is incorporated herein by reference in its entirety as if set forth herein.

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

SEQUENCE LISTING

Not Applicable

STATEMENT REGARDING PRIOR DISCLOSURES BY THE INVENTOR OR A JOINT INVENTOR

Not Applicable

BACKGROUND OF THE DISCLOSURE

1. Field of the Invention

The present invention relates to systems and methods for operating an ARINC-429 transmitter, and avionics data transmission systems using the innovative ARINC-429 transmitter.

2. Description of Related Art

ARINC-429 is a technical standard for data communication in aircraft and defines the physical and electrical interface as well as the data protocol for avionics data systems. The name "ARINC 429" comes from the company "Aeronautical Radio, Incorporated" (ARINC), which has developed a large number of standards for the aircraft industry.

The ARINC-429 interface is widely used in commercial aviation and enables the transmission of data between avionics systems in a point-to-point mode at fixed data rates.

Although widely accepted and used in numerous aircraft, the ARINC-429 interface also has certain disadvantages. For example, an ARINC-429 interface offers the option of operating with two different data transmission rates, wherein the lower data transmission rate is in the range between 12-14.5 kb/s and the higher data transmission rate is 100 kb/s±1%.

As a rule, an ARINC-429 interface is preconfigured so that it is operated at one of the two speeds, so that changing the data transmission speed is not intended. However, it is also possible to communicate according to the ARINC-429 standard, in which the data transmission speed can be switched between the low and high transmission speed. In this case, a commercially used ARINC-429 driver module can be used, which has a dedicated input pin with which the slew rate can be switched according to the ARINC-429 standard. By changing the slew rate, it is therefore possible to switch between the lower transmission rate and the higher transmission rate. The disadvantage of this is that this implementation is cost-intensive and also requires the presence of the additional pin (with corresponding wiring and controls).

It is an object of the present invention to provide an ARINC-429 transmitter which overcomes or at least mitigates the disadvantages described above when changing the data transmission speed.

BRIEF SUMMARY OF THE INVENTION

In an exemplary embodiment of the present invention, a system for operating an ARINC-429 compatible transmitter comprises an ARINC-429 compatible transmitter for receiving a signal sequence from a transmission unit and for converting the signal sequence into a differential output signal for output to a receiver, and the transmission unit for generating a signal sequence for the ARINC-429 transmitter, wherein the ARINC-429 transmitter is configured to transmit an output signal at a high or a low transmission rate to the receiver depending on a received signal sequence from the transmission unit. Preferably, the data transmission rate at low transmission rate is in the range of 12-14.5 kb/s±1% and the data transmission rate at high transmission rate is 100 kb/s±1%.

In another exemplary embodiment of the present invention, a method of operating an ARINC-429 compatible transmitter comprises using an ARINC-429-compatible transmitter in its regular configuration for transmitting data at a high transmission rate when data is to be transmitted at a high transmission rate, and supplying the ARINC-429 transmitter with a specific signal sequence of a transmission unit which causes the ARINC-429 transmitter to transmit data at a low transmission rate, such that edges in the signal sequence are modified by switching between a defined low state or a defined high state to a high impedance state.

Advantageous embodiments of the present invention are described in the respective dependent claims in this case.

According to the invention, it is provided that the system according to the invention comprises an ARINC-429 transmitter for receiving a signal sequence from a transmission unit and for converting the signal sequence into a differential output signal for outputting to a receiver and the transmission unit for generating a signal sequence for the ARINC-429 transmitter. The system is characterized in that the ARINC-429 transmitter is configured to transmit an output signal at a high or a low transmission rate to the receiver depending on a received signal sequence from the transmission unit, preferably wherein the data transmission rate is standard compliant between 12-14.5 kbps+−1%, preferably 12.5 kbps at low transmission rate and 100 kbps+−1% at high transmission rate.

In contrast to the previous implementation for switching between the two data transmission speeds, an additional pin on the transmission unit is no longer required, as the change in data transmission speed is transmitted directly via the signal to be converted by the ARINC-429 transmitter. The ARINC-429 transmitter itself does not change its actual data transmission speed, but is controlled in a specific way in relation to the signal sequence to be processed by it, so that both high-speed and low-speed data transmission is also possible at the output of the ARINC-429 transmitter. The advantage here is that no hardware changes need to be made to the ARINC-429 transmitter, only the transmission unit stationary with the ARINC-429 transmitter needs to be designed accordingly. When communicating at the high data transmission speed, standard signaling is transmitted from the transmission unit to the ARINC-429 transmitter, wherein it is processed regularly. If it is then desired, for example, to use the ARINC-429 transmitter with a lower data transmission rate, a different signal sequence is sent to the ARINC-429 transmitter, which causes the ARINC-429 transmitter to output a signal with the lower data transmission rate. The system according to the invention can be operated independently of the data rate and the resulting frequency. No additional pins are required for speed regulation and significant cost savings can be made as no integrated component needs to be used. In addition, the implementation according to the invention also enables simultaneous improved flexibility in the design.

In an exemplary embodiment, in a system comprising an ARINC-429 compatible transmitter configured to operate with two different data transmission rates, a lower data transmission rate and a higher data transmission rate and a transmission unit with switching means for signaling a switching of the data transmission rate, wherein a conventional switching means comprises an input pin provided for signaling the switching of the data transmission rate at the transmission unit, the improvement comprising an improved switching means comprising a wireless switching means provided by the transmission unit to the ARINC-429 compatible transmitter, wherein the data transmission rate of the ARINC-429 compatible transmitter is switched between the low and high data transmission rates based upon a received signal sequence from the transmission unit.

It is now the underlying idea of the present invention that the output of the ARINC-429 transmitter with a high data transmission rate or with a lower data transmission rate can be changed simply by modifying the signal sequence to be converted by the ARINC-429 transmitter accordingly, and that no separate signaling line is required to switch the ARINC-429 transmitter between a first processing mode with a low data transmission rate and a second processing mode with a high data transmission rate.

According to an advantageous modification of the present invention, it may be provided that the ARINC-429 transmitter is configured to be capable of transmitting an output signal to the receiver at a high transmission rate. The basic configuration of the ARINC-429 transmitter is therefore set to transmit data at high speed. A specific signal sequence sent to the ARINC-429 transmitter then causes an output signal from the transmitter, which is actually configured for high data transmission speed, which corresponds to a transmitter with low data transmission speed. This ensures compatibility with systems that require high and/or low data transfer speeds.

According to the invention, it may further be provided that the transmission unit is configured to, when the ARINC-429 transmitter is to be operated at the low transmission rate, modify the signal sequence to be sent to the ARINC-429 transmitter in its rising and falling edges.

By modifying the signal sent by the transmission unit with regard to its state changes, an output edge is generated at the output of the ARINC-429 transmitter that rises slowly in relation to the high data transmission speed and corresponds to the output signal that would occur at a low data transmission speed. Corresponding consumers of the output signal generated by the ARINC-429 transmitter in this way perceive the output signal generated in this way as a signal that has been generated by the transmitter at low data transmission speed, as the edge has the typical slope for this. In this case, according to an advantageous embodiment of the present invention, the modification of the signal edge from a change between the low state and the high state can extend over at least 5 μs, preferably at least 8 us and more preferably at least 10 μs. Furthermore, in this case it may be provided that the change does not take longer than 15 μs.

According to an optional modification of the present invention, it may be provided that the signal sequence of the transmission unit represents at least one rectangular signal, in particular exclusively rectangular signals, wherein their edges (and of course also their duration and the distances between the rectangular signals) are modified or not depending on whether the ARINC-429 transmitter is to be operated at a high transmission rate or at a low transmission rate. In other words, the symbol time of the symbol output by the transmitter is modified.

The ARINC-429 standard generally only uses rectangular signals to control the ARINC-429 transmitter, wherein it can be provided that there are two separate input lines to the transmitter. Sending a rectangular signal on the first of the two separate input lines then results in a logical 1 being transmitted on the output line of the ARINC-429 transmitter, whereas sending a rectangular signal on the other of the two separate input lines results in a logical 0 being transmitted. In this case, the transmission of the corresponding rectangular signals on the two separate input lines must be synchronized so that the bit sequence on the output line takes place at the desired data transmission rate. Further, it can be provided that the signals are dependent on each other. This means that the "1" on line A without a signal from line B does not result in a 1, as the differential level of 10V cannot then be reached.

According to an optional modification of the present invention, it may be provided that the transmission unit is configured to implement a modified edge by switching between the high state and a high impedance state several times, preferably more than five times, when changing from low to high, and/or when changing from high to low, switching several times, preferably more than five times, between the low state and a high impedance state.

By switching between the high state or the low state and a high impedance state at the input lines, the output signal of the ARINC-429 transmitter does not jump immediately to the maximum or minimum voltage value that can be output by it, but increases with a corresponding slope to the maximum voltage value or decreases continuously with a corresponding slope to the minimum voltage value, i.e., the edge of the output signal is delayed.

Furthermore, in this case it may be provided that the transmission unit is configured to switch between the high impedance state and a low value or a high value at a modified edge for a change between low and high with a frequency of at least 62.5 kHz, preferably at least 500 kHz and more preferably at least 1.0 MHz.

According to an optional embodiment of the invention, it may be provided that the transmission unit is configured to output a modified edge until the output signal of the ARINC-429 transmitter has reached a predefined threshold value, e.g., 7.5, preferably 8 V and more preferably 9 V.

Accordingly, according to the invention, it may thus be provided that the transmission unit which generates the modified edge in the signal sequence to give the output signal of the ARINC-429 transmitter the shape according to which low data transmission speed is used senses the output signal of the ARINC-429 transmitter. This can advantageously be done so that the duration of the modification of the edge of the input signal or the signal sequence can be modified for a correspondingly long period of time.

According to the invention, it may be provided that for switching between the low transmission rate and the high transmission rate, only the signal sequence of the transmission unit forming a data word is required and, in particular, no additional pin is provided for signaling a switching of the speed of the transmission rate at the transmission unit.

According to a further advantageous modification of the present invention, it may be provided that the transmission unit is connected to the ARINC-429 transmitter via two mutually separate input lines, and/or the ARINC-429 transmitter comprises two output lines, the differential voltage level of which defines the output signal.

In addition, according to an advantageous modification of the present invention, it may be provided that the transmission unit senses the output signal, in particular the differential output signal, of the ARINC-429 transmitter, preferably in order to determine a duration of a modification of an edge of a rectangular signal in time as a function thereof.

According to a further advantageous embodiment of the present invention, it may be provided that a duty cycle when switching between the high impedance state and a low value or a high value is at a fixed value, preferably at 50%.

Alternatively, the duty cycle (also referred to as the duty cycle) can also be changed during the modification of an edge, e.g., in such a way that the duty cycle at the start of a modified edge has a lower value than at the end of a modified edge. Thus, when modifying a rising edge towards the end of the modification process, the ratio of a high state to the high impedance state can be greater than at the beginning of the edge modification. Analogous considerations also apply to modifying a falling edge.

The invention further relates to a method of operating an ARINC-429 transmitter, preferably using a system according to any of the preceding aspects, wherein an ARINC-429 transmitter is regularly used in its configuration for transmitting high transmission rate data when high transmission rate data is to be transmitted, and the ARINC-429 transmitter is supplied with a specific signal sequence from a transmission unit which causes the ARINC-429 transmitter to transmit data at a low transmission rate, such that edges in the signal sequence are modified by switching (several times) between a defined low state or a defined high state to a high impedance state.

According to an advantageous modification of the method according to the invention, it may be provided that the modifying of the edges is performed by the transmission unit until the output signal of the ARINC-429 transmitter reaches a predetermined threshold value, in particular a voltage threshold value, for example 7.5 V, preferably 8 V and more preferably 9 V.

In this case, it may advantageously be provided that the modification of the edges results in that the output signal comprises a desired slope in the decreasing or rising edge, which is typical for an edge with a lower transmission speed.

The invention further relates to an aircraft comprising a system according to one of the preceding aspects or using the method according to one of the preceding aspects.

These and other objects, features and advantages of the present invention will become more apparent upon reading the following specification in conjunction with the accompanying drawing figures.

BRIEF DESCRIPTION OF THE DRAWINGS

The accompanying Figures, which are incorporated in and constitute a part of this specification, illustrate several aspects described below.

DETAIL DESCRIPTION OF THE INVENTION

Figure 1:
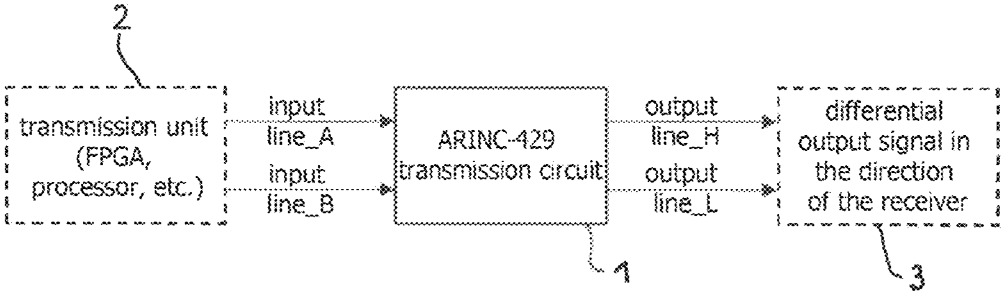
FIG. 1 is a schematic representation of an embodiment of a system for operating an ARINC-429 transmitter.

To facilitate an understanding of the principles and features of the various embodiments of the invention, various illustrative embodiments are explained below. Although exemplary embodiments of the invention are explained in detail, it is to be understood that other embodiments are contemplated. Accordingly, it is not intended that the invention is limited in its scope to the details of construction and arrangement of components set forth in the following description or illustrated in the drawings. The invention is capable of other embodiments and of being practiced or carried out in various ways. Also, in describing the exemplary embodiments, specific terminology will be resorted to for the sake of clarity.

It must also be noted that, as used in the specification and the appended claims, the singular forms “a,” “an” and “the” include plural references unless the context clearly dictates otherwise. For example, reference to a component is intended also to include composition of a plurality of components. References to a composition containing “a” constituent is intended to include other constituents in addition to the one named.

Also, in describing the exemplary embodiments, terminology will be resorted to for the sake of clarity. It is intended that each term contemplates its broadest meaning as understood by those skilled in the art and includes all technical equivalents which operate in a similar manner to accomplish a similar purpose.

Ranges may be expressed herein as from “about” or “approximately” or “substantially” one particular value and/or to “about” or “approximately” or “substantially” another particular value. When such a range is expressed, other exemplary embodiments include from the one particular value and/or to the other particular value.

Similarly, as used herein, “substantially free” of something, or “substantially pure”, and like characterizations, can include both being “at least substantially free” of something, or “at least substantially pure”, and being “completely free” of something, or “completely pure”.

By “comprising” or “containing” or “including” is meant that at least the named compound, element, particle, or method step is present in the composition or article or method, but does not exclude the presence of other compounds, materials, particles, method steps, even if the other such compounds, material, particles, method steps have the same function as what is named.

It is also to be understood that the mention of one or more method steps does not preclude the presence of additional method steps or intervening method steps between those steps expressly identified. Similarly, it is also to be understood that the mention of one or more components in a composition does not preclude the presence of additional components than those expressly identified.

The materials described as making up the various elements of the invention are intended to be illustrative and not restrictive. Many suitable materials that would perform the same or a similar function as the materials described herein are intended to be embraced within the scope of the invention. Such other materials not described herein can include, but are not limited to, for example, materials that are developed after the time of the development of the invention.

FIG. 1 shows an overview of the system for operating an ARINC-429 transmitter 1. This is supplied with corresponding input signals by a transmission unit 2 and then indicates a corresponding output signal to a consumer 3. In this case, the input line can consist of several mutually configured separate input lines (Input_Line_A and Input_Line_B), as is usual for the ARINC-429 standard. The output signal is also transmitted via two lines (Output_Line_High and Output_Line_Low) and defined using a voltage difference between these two lines.

In this case, the transmission unit 2 can be an FPGA, a processor or the like.

Figure 2A:
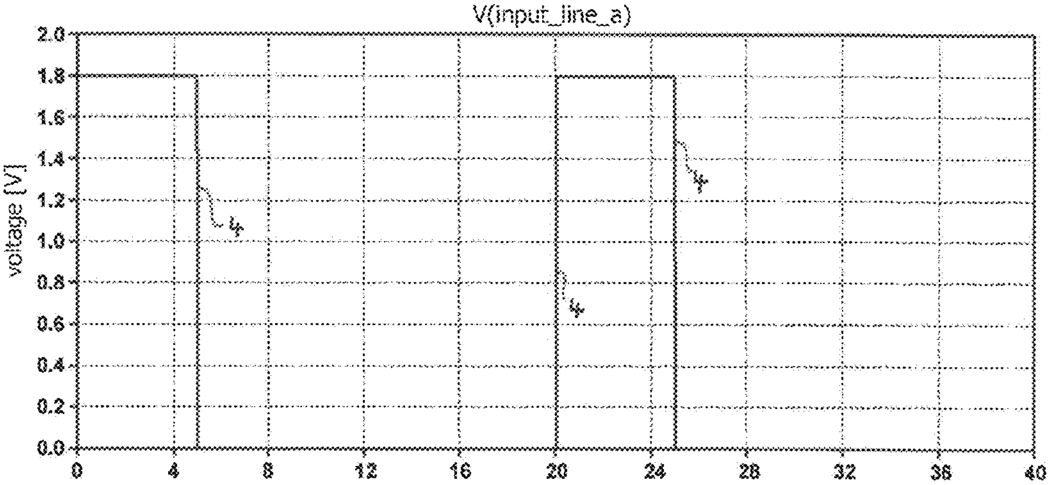
FIGS. 2A-2C illustrate representations of the input and output signals of the ARINC-429 transmitter at a high transmission speed.
Figure 2B:
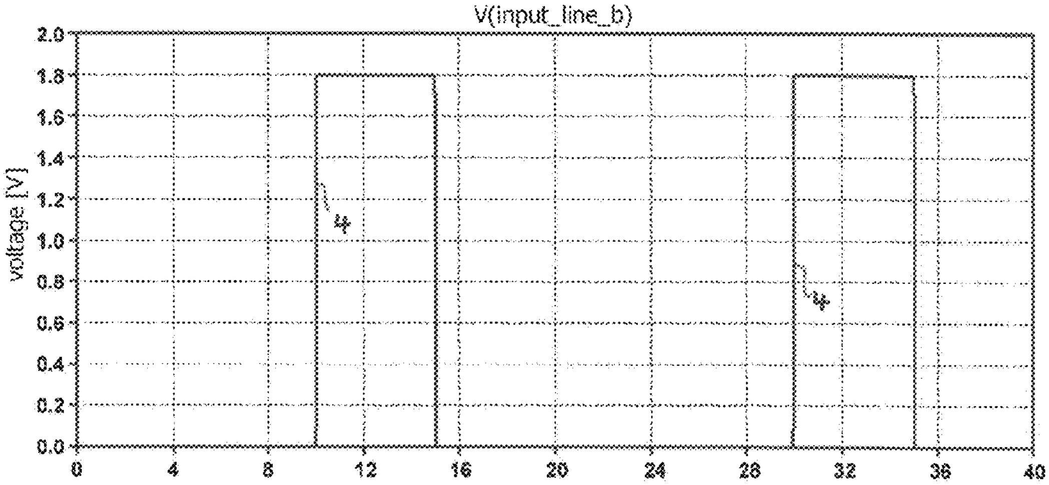
Figure 2C:
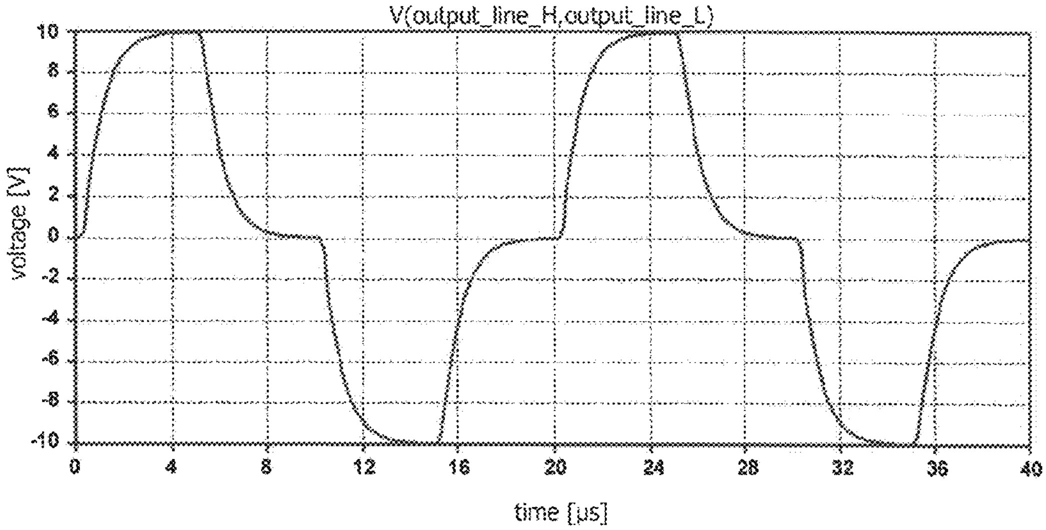

In this case, FIG. 2C shows a bit sequence for 100 kb/s, which corresponds to a high data transmission speed. FIGS. 2A-2B show the two single-ended input signals of the two input signal lines to the differential output signal (in FIG. 2C). The signals are output from transmission unit 1 via the two input signal lines (Input_Line_A and Input_Line_B). The output signals of the ARINC-429 transmitter circuit are output here as a differential output signal, which can be detected in FIG. 2C.

With the approach according to the invention, the ARINC-429 transmitter can transmit different data rates according to the standard without hardware modification. For transmission purposes there are required different signal sequences on the input lines (also referred to as bitstreams) for the different data rates. For transmission at a high speed, the states are implemented via signaling by means of logic 1 (high) and logic 0 (low). At logic 1, edge 4 increases through a defined filter. At logical 0, the edge decreases accordingly. The signal sequence used here is used without modification to the standard, resulting in full compatibility with an ARINC-429 transmitter configured for use with a high data transmission rate. The output signal sequence and the corresponding input signal at transmitter 1 can be detected in this case in FIGS. 2A-2C.

A rectangular pulse (of 0-5 μs) on the first of the two input lines results in a signal in the range of 0-10 μs at the output of the transmitter, which represents a set bit, i.e., 1, according to the ARINC-429 standard. A rectangular signal on the second of the two separate input lines (from 10-15 μs) results in the characteristic shape at the output signal (in the range of 10-20 μs), which stands for bit "0" according to the standard. It can therefore be detected that the signaling shown in FIG. 2C signals the bit pattern "1010". In this case, the data transmission speed amounts to 100 kb/s, as 1 bit is transmitted every 10 μs.

According to the invention, if one now wishes to use the ARINC-429 transmitter with a low data transmission speed, it is only necessary to modify the input signals. In this case, in particular, in addition to the duration and signaling time, the edge at a change between a low state and a high state is modified accordingly so that an edge whose slope corresponds to the one that would be obtained if an ARINC-429 transmitter that is preconfigured with the low data transmission rate were actually used.

Figure 3A:
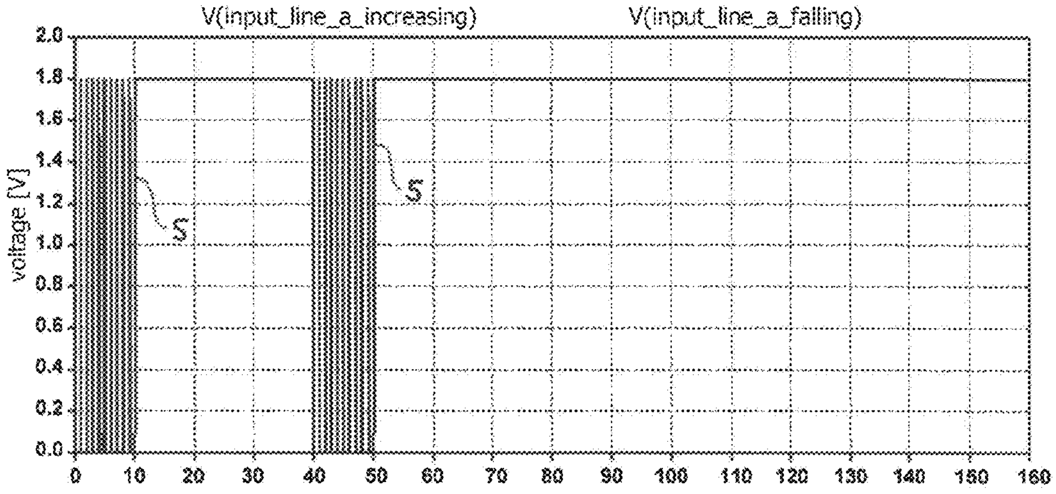
FIGS. 3A-3C illustrate representations of the input and output signals of the ARINC-429 transmitter at a low transmission speed.
Figure 3B:
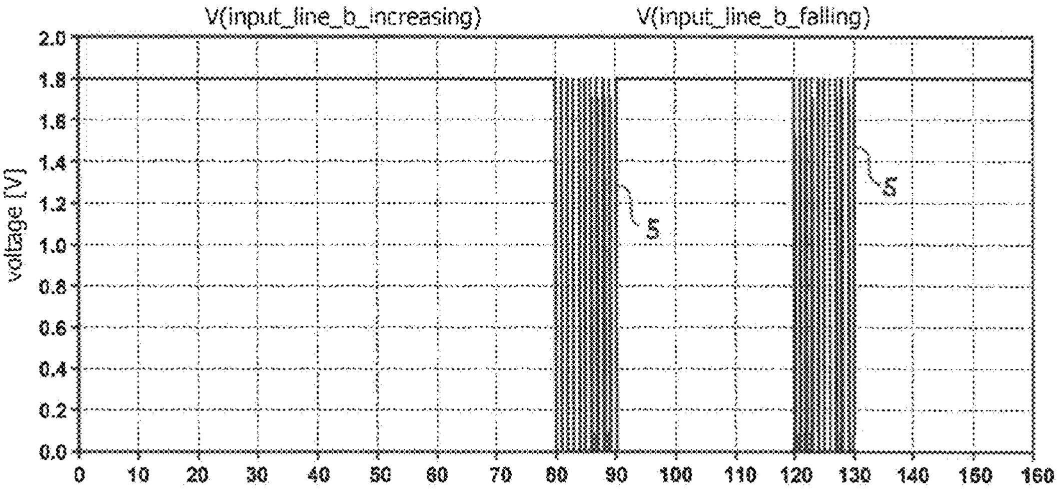
Figure 3C:
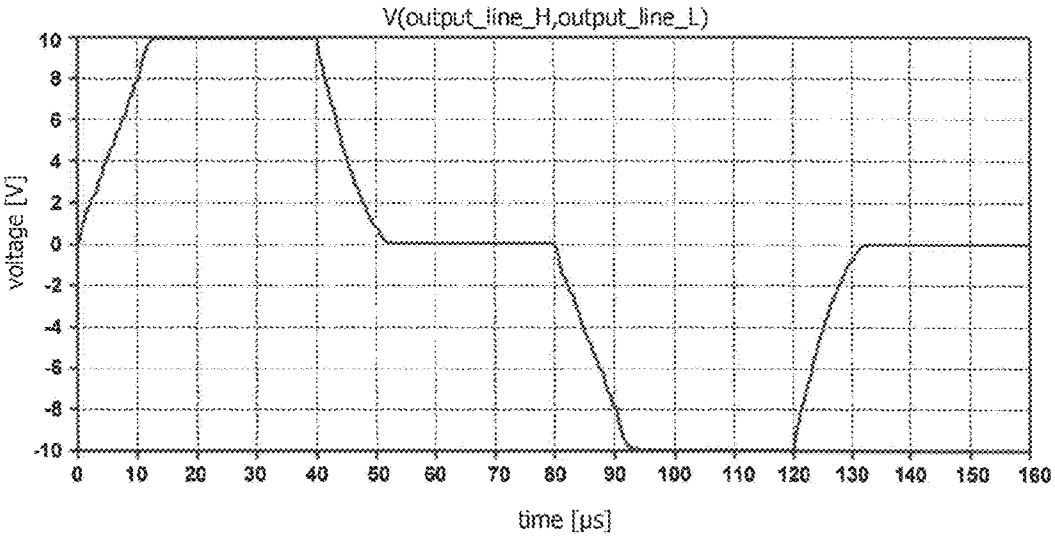

FIGS. 3A-3C show the input signal sequences for achieving the desired effect. If one now wants to use the ARINC-429 transmitter in such a way that on its output there is adjacent an output signal which is typical for a low data transmission speed, a simple rectangular signal can no longer be used as input sequence. In this case, the edge 5 must be modified when changing between a low state and a high state in such a way that it switches to a high impedance state several times. For example, at an edge from low to high, the system switches several times between high and the high impedance state. Switching between these states delays the rising edge in the output signal. In this case, the input signal sequence consists of varying on and off times in order to generate a monotonically increasing signal in the output signal. As soon as the predefined target voltage value of the high state is reached, the state remains high until the falling edge is initiated. At the falling edge, the input signal sequence changes between low and high impedance state to also delay the falling edge. The state changes take place until the predefined target voltage for the low state is reached. The status then remains at low. FIGS. 3A-3B shows what the single-ended transmitter signal looks like, whereas FIG. 3C shows the differential output signal of the transmitter circuit.

In FIG. 3C you can detect the transmitted bit pattern "10" with a transmission speed of 12.5 kb/s, as 1 bit is transmitted every 80 μs.

Numerous characteristics and advantages have been set forth in the foregoing description, together with details of structure and function. While the invention has been disclosed in several forms, it will be apparent to those skilled in the art that many modifications, additions, and deletions, especially in matters of shape, size, and arrangement of parts, can be made therein without departing from the spirit and scope of the invention and its equivalents as set forth in the following claims. Therefore, other modifications or embodiments as may be suggested by the teachings herein are particularly reserved as they fall within the breadth and scope of the claims here appended.

What is claimed is:

1. A system comprising:
- a transmission unit configured to generate a signal sequence; and
- an ARINC-429 compatible transmitter configured to:
  - receive the signal sequence from the transmission unit;
  - convert the signal sequence into a differential output signal for output to a receiver; and
  - transmit the differential output signal to the receiver at a transmission rate based upon the received signal sequence from the transmission unit;
  - wherein the transmission rate is selected from a group consisting of a high transmission rate and a low transmission rate;
- wherein the transmission unit is further configured to sense the differential output signal in order to determine a duration of a modification of an edge of the signal sequence, being a rectangular signal, in time.

2. The system of claim 1, wherein at least one of:
- the high transmission rate is 100 kb/s±1%; or
- the low transmission rate is in the range of from 12 to 14.5 kb/s±1%.

3. The system according to claim 1, wherein for switching between the low transmission rate and the high transmission rate, only the signal sequence forming a data word is required.

4. The system according to claim 1, wherein at least one of:
- the transmission unit is connected to the ARINC-429 compatible transmitter via two mutually separate input lines; or
- the ARINC-429 compatible transmitter comprises two output lines whose differential voltage level defines the differential output signal.

5. An aircraft comprising the system of claim 1.

6. A system, comprising:

a transmission unit configured to generate a signal sequence; and an ARINC-429 compatible transmitter configured to:

receive the signal sequence from the transmission unit;

convert the signal sequence into a differential output signal for output to a receiver; and transmit the differential output signal to the receiver at a transmission rate based upon the received signal sequence from the transmission unit;

wherein the transmission rate is selected from a group consisting of a high transmission rate and a low transmission rate;

wherein:

the transmission unit is further configured to generate:

an unmodified signal sequence when the ARINC-429 compatible transmitter is to be operated at the high transmission rate; and a modified signal sequence when the ARINC-429 compatible transmitter is to be operated at the low transmission rate; and the modified signal sequence has a modification to the unmodified signal sequence of at least one of:

a modified rising edge;

a modified falling edge; or a modified bit duration.

7. The system of claim 6, wherein the transmission unit is further configured to implement a modified edge by at least one of:

switching between a high state and a high impedance state more than five times, when changing from the low transmission rate to the high transmission rate; or switching between a low state and the high impedance state more than five times, when changing from the high transmission rate to the low transmission rate.

8. The system of claim 6, wherein at least one of:

the high transmission rate is 100 kb/s±1%; or the low transmission rate is in the range of from 12 to 14.5 kb/s±1%.

9. The system according to claim 6, wherein the transmission unit is further configured to sense the differential output signal in order to determine a duration of a modification of an edge of the signal sequence, being a rectangular signal, in time.

10. A system, comprising:

a transmission unit configured to generate a signal sequence; and an ARINC-429 compatible transmitter configured to:

receive the signal sequence from the transmission unit;

convert the signal sequence into a differential output signal for output to a receiver; and transmit the differential output signal to the receiver at a transmission rate based upon the received signal sequence from the transmission unit;

wherein the transmission rate is selected from a group consisting of a high transmission rate and a low transmission rate;

wherein the transmission unit is further configured to modify at least one of:

a rising edge of the signal sequence;

a falling edge of the signal sequence; or a bit duration of the signal sequence.

11. The system of claim 10, wherein, at a modified edge, the transmission unit is further configured to switch between the low transmission rate and the high transmission rate at a frequency of at least 62.5 kHz between a high impedance state and a low value or a high value.

12. The system of claim 10, wherein the transmission unit is further configured to output a modified edge for so long until the differential output signal has reached a predefined threshold value.

13. The system of claim 10, wherein a duty cycle when switching between a high impedance state and a low value or a high value is at a fixed value.

14. The system of claim 10, wherein at least one of:

the high transmission rate is 100 kb/s±1%; or the low transmission rate is in the range of from 12 to 14.5 kb/s±1%.

15. The system according to claim 10, wherein the transmission unit is further configured to sense the differential output signal in order to determine a duration of a modification of an edge of the signal sequence, being a rectangular signal, in time.

16. A system, comprising:

a transmission unit configured to generate a signal sequence; and an ARINC-429 compatible transmitter configured to:

receive the signal sequence from the transmission unit;

convert the signal sequence into a differential output signal for output to a receiver; and transmit the differential output signal to the receiver at a transmission rate based upon the received signal sequence from the transmission unit;

wherein the transmission rate is selected from a group consisting of a high transmission rate and a low transmission rate;

wherein the transmission rate of the differential output signal is changed by modifying the signal sequence.

17. The system of claim 16, wherein at least one of:

the high transmission rate is 100 kb/s±1%; or the low transmission rate is in the range of from 12 to 14.5 kb/s±1%.

18. The system according to claim 16, wherein the transmission unit is further configured to sense the differential output signal in order to determine a duration of a modification of an edge of the signal sequence, being a rectangular signal, in time.

19. A system, comprising:

a transmission unit configured to generate a signal sequence; and an ARINC-429 compatible transmitter configured to:

receive the signal sequence from the transmission unit;

convert the signal sequence into a differential output signal for output to a receiver; and transmit the differential output signal to the receiver at a transmission rate based upon the received signal sequence from the transmission unit;

wherein the transmission rate is selected from a group consisting of a high transmission rate and a low transmission rate;

wherein:

the signal sequence represents at least one rectangular signal; and edges of the signal sequence and/or a level duration of the differential output signal is modified, or not, depending on whether the ARINC-429 compatible transmitter is to be operated at the high transmission rate or at the low transmission rate.

20. The system of claim 19, wherein at least one of:

the high transmission rate is 100 kb/s±1%; or the low transmission rate is in the range of from 12 to 14.5 kb/s±1%.

21. The system according to claim 19, wherein the transmission unit is further configured to sense the differential output signal in order to determine a duration of a modification of an edge of the signal sequence, being a rectangular signal, in time.

22. In a system comprising:

an ARINC-429 compatible transmitter configured to operate with two different data transmission rates, a lower data transmission rate and a higher data transmission rate;

a transmission unit with switching means for signaling a switching of the data transmission rate; and an input pin provided for signaling the switching of the data transmission rate at the transmission unit;

the improvement comprising:

instead of an input pin for signaling the switching of the data transmission rate at the transmission unit, a wireless switching means is provided by the transmission unit to the ARINC-429 compatible transmitter;

wherein:

the data transmission rate of the ARINC-429 compatible transmitter is switched between the lower and higher data transmission rates based upon a received signal sequence from the transmission unit;

the output of the ARINC-429 compatible transmitter with the lower and higher data transmission rates is changed by modifying the received signal sequence to be converted by the ARINC-429 compatible transmitter accordingly; and no separate signaling line is required to switch the ARINC-429 compatible transmitter between a first processing mode with the lower data transmission rate and a second processing mode with the higher data transmission rate.

23. A method comprising:

transmitting an output signal from an ARINC-429 compatible transmitter at a high transmission rate of 100 kb/s±1%;

based upon receiving a signal sequence from a transmission unit, transmitting the output signal from the ARINC-429 compatible transmitter at a low transmission rate of between 12 to 14.5 kb/s±1%; and modifying edges in the signal sequence by switching between a defined low state or a defined high state to a high impedance state.

24. The method of claim 23, wherein the modifying of the edges is performed by the transmission unit for as long as the output signal of the ARINC-429 compatible transmitter reaches a predetermined threshold value.

25. The method of claim 23, wherein modifying the edges results in the output signal having a desired slope in a decreasing or rising edge.

26. An aircraft configured to operate the method of claim 23.

* * * * *